United States Patent
Uechi et al.

(10) Patent No.: US 11,527,645 B2
(45) Date of Patent: Dec. 13, 2022

(54) SEMICONDUCTOR DEVICE

(71) Applicant: KIOXIA CORPORATION, Tokyo (JP)

(72) Inventors: Tadayoshi Uechi, Kawasaki Kanagawa (JP); Takashi Izumida, Kamakura Kanagawa (JP); Takeshi Shimane, Matsudo Chiba (JP)

(73) Assignee: KIOXIA CORPORATION, Tokyo (JP)

( * ) Notice: Subject to any disclaimer, the term of this patent is extended or adjusted under 35 U.S.C. 154(b) by 7 days.

(21) Appl. No.: 16/526,025

(22) Filed: Jul. 30, 2019

(65) Prior Publication Data

US 2020/0295191 A1    Sep. 17, 2020

(30) Foreign Application Priority Data

Mar. 15, 2019    (JP) .............................. JP2019-049086

(51) Int. Cl.
*H01L 29/78*    (2006.01)
*H01L 29/10*    (2006.01)
*H01L 29/08*    (2006.01)

(52) U.S. Cl.
CPC ...... *H01L 29/7836* (2013.01); *H01L 29/0847* (2013.01); *H01L 29/1041* (2013.01)

(58) Field of Classification Search
CPC ............. H01L 29/7836; H01L 29/1041; H01L 29/0847; H01L 29/66492; H01L 29/7833; H01L 21/823412; H01L 21/823807; H01L 29/1045

See application file for complete search history.

(56) References Cited

U.S. PATENT DOCUMENTS

| | | | |
|---|---|---|---|
| 7,064,399 B2 | 6/2006 | Babcock et al. | |
| 7,888,747 B2 | 2/2011 | Hokazono | |
| 2006/0154425 A1* | 7/2006 | Yang | H01L 29/7833 438/287 |
| 2006/0216900 A1* | 9/2006 | Wang | H01L 29/6659 438/306 |
| 2015/0041916 A1 | 2/2015 | Yu et al. | |

FOREIGN PATENT DOCUMENTS

JP    2009-283496 A    12/2009

\* cited by examiner

*Primary Examiner* — Monica D Harrison
*Assistant Examiner* — John Lin
(74) *Attorney, Agent, or Firm* — Foley & Lardner LLP (57) ABSTRACT

A semiconductor device of an embodiment includes: a first and second semiconductor regions of a first conductivity type; a third semiconductor region of a second conductivity type disposed between the first and second semiconductor regions; a fourth semiconductor region of the first conductivity type disposed below the first semiconductor region; a fifth semiconductor region of the first conductivity type disposed below the second semiconductor region; a first region containing carbon disposed between the first and fourth semiconductor regions; a second region containing carbon disposed between the second and fifth semiconductor regions; a third region disposed between the first and second regions; the first and second regions having a first and second carbon concentrations respectively, the third region not containing carbon or having a lower carbon concentration than the first and second carbon concentrations in a portion below an end of a lower face of a gate electrode.

10 Claims, 10 Drawing Sheets

SEMICONDUCTOR DEVICE

CROSS REFERENCE TO RELATED APPLICATIONS

This application is based upon and claims the benefit of priority from the prior Japanese Patent Application No. 2019-049086, filed on Mar. 15, 2019, the entire contents of which are incorporated herein by reference.

FIELD

Embodiments described herein relate generally to semiconductor devices including a MOS transistor.

BACKGROUND

Normally, a p-channel MOS transistor includes a semiconductor region containing boron, which serves as an active region. There is a technique in which a carbon-doped region is disposed between the semiconductor region and an n-type silicon semiconductor layer on which the p-channel MOS transistor is formed in order to prevent boron in the semiconductor region from diffusing into the n-type silicon semiconductor layer.

This technique has a problem in that a junction leakage may be caused between the semiconductor region and the n-type silicon semiconductor layer.

DETAILED DESCRIPTION

A semiconductor device according to an embodiment includes: a first semiconductor region of a first conductivity type and a second semiconductor region of the first conductivity type, which are disposed to be separate from each other; a third semiconductor region of a second conductivity type disposed between the first semiconductor region and the second semiconductor region; a fourth semiconductor region of the first conductivity type disposed below the first semiconductor region and having a lower concentration of a first conductivity type impurity than the first semiconductor region; a fifth semiconductor region of the first conductivity type disposed below the second semiconductor region and having a lower concentration of the first conductivity type impurity than the second semiconductor region; a first region containing carbon disposed between the first semiconductor region and the fourth semiconductor region; a second region containing carbon disposed between the second semiconductor region and the fifth semiconductor region; a third region disposed between the first region and the second region; a gate electrode disposed above the third semiconductor region; and an insulating film disposed between the third semiconductor region and the gate electrode, the first region having a first carbon concentration, the second region having a second carbon concentration, the third region not containing carbon or having a lower carbon concentration than the first carbon concentration and the second carbon concentration in a portion below at least one of ends of a lower face of the gate electrode in a first direction from the first semiconductor region to the second semiconductor region.

An embodiment of the present invention will be described below with reference to the accompanying drawings.

Figure 1:
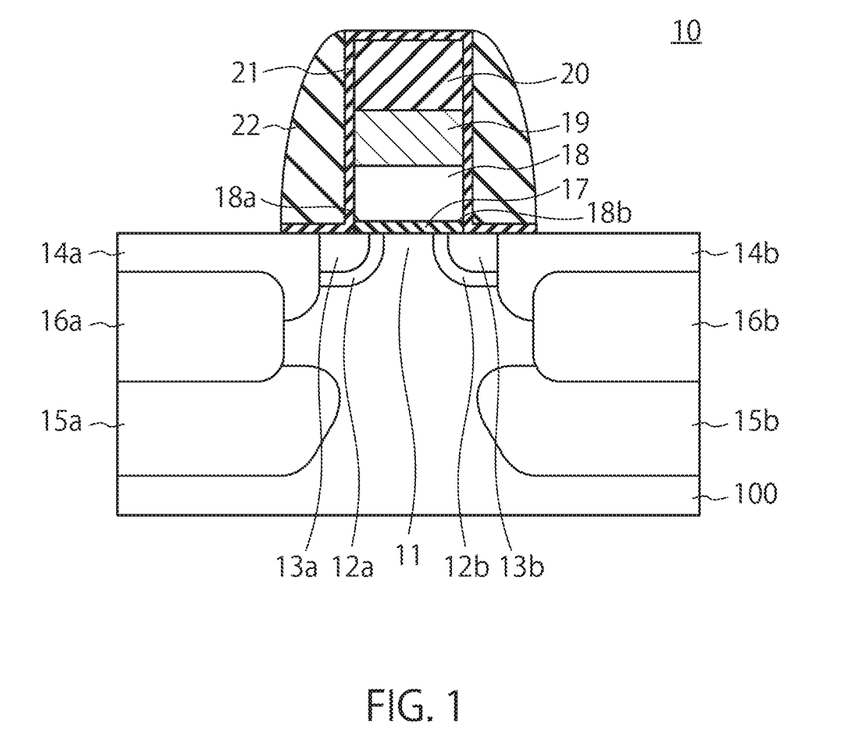
FIG. 1 is a cross-sectional view of a semiconductor device according to an embodiment.

FIG. 1 shows a semiconductor device according to the embodiment. The semiconductor device according to the embodiment includes a p-channel MOS transistor (which will also be referred to as "transistor" below) 10. The transistor 10 has n-type semiconductor regions ("halo regions") 12a and 12b disposed to be separate from each other in an n-type silicon semiconductor layer 100, p-type semiconductor regions 13a and 13b having a lower impurity concentration, each disposed to be adjacent to one of the halo regions 12a and 12b, and p-type semiconductor regions 14a and 14b having a higher impurity concentration, each being disposed to be adjacent to one of the semiconductor regions 13a and 13b and deeper than the semiconductor regions 13a and 13b. One of the semiconductor regions 14a and 14b serves as a source and the other serves as a drain. Boron is normally used as the p-type impurity. An n-type silicon layer between the n-type semiconductor regions 12a and 12b is a channel region 11.

The semiconductor device 10 also has p-type semiconductor regions 15a and 15b disposed below the semiconductor regions 14a and 14b to be separate from the semiconductor regions 14a and 14b, the p-type semiconductor regions 15a and 15b having a lower impurity concentration than the semiconductor regions 14a and 14b. The transistor 10 also has a region 16a containing carbon, which is disposed between the semiconductor region 14a and the semiconductor region 15a, and a region 16b containing carbon, which is disposed between the semiconductor region 14b and the semiconductor region 15b. The carbon-containing regions 16a and 16b also contain dusters of boron, carbon, and interstitial silicon.

The halo regions 12a and 12b contain an n-type impurity, which is at least one of arsenic (As) and phosphorus (P), for example. The halo regions 12a and 12b may prevent a depletion layer from extending too much from the p-type semiconductor regions 13a and 13b in a horizontal direction (toward the channel region 11). Therefore, the presence of the halo regions 12a and 12b improves the roll-off in the short channel, for example the roll-off characteristics (Lg-Vth characteristics) of the threshold voltage (Vth) with respect to the gate length (Lg). As a result, the relationship between the on current and the off current may be properly maintained.

The p-type semiconductor regions 13a and 13b have a lightly-doped-drain (LDD) structure, and contain boron (B) as the p-type impurity. The LDD structure is provided to decrease the electric field in the vicinity of one of the semiconductor region 14a and the semiconductor region 14b that serves as a drain by suppressing the generation of hot carriers.

The transistor 10 also includes a gate insulating film 17 disposed on the channel region 11. A polycrystalline silicon layer 18 is disposed on the gate insulating film 17, a tungsten layer 19 is disposed on the polycrystalline silicon layer 18, and a silicon nitride layer 20 is disposed on the tungsten layer 19.

The polycrystalline silicon layer 18 and the tungsten layer 19 serve as a gate electrode of the transistor 10. The tungsten layer 19 is a protective layer that prevents p-type impurities from reaching the channel region when the semiconductor regions 15a and 15b, which are deeper than the semiconductor regions 14a and 14b, are formed. The silicon nitride layer 20 is used as a mask when the gate electrode is formed, and to prevent the tungsten layer 19 from being contaminated during the formation of the transistor 10.

The halo regions 12a and 12b extend to immediately below portions of the gate electrode. The p-type semiconductor regions 13a and 13b also extend to immediately below the portions of the gate electrode, but the distance between the semiconductor regions 13a and 13b in the channel length direction is greater than the distance between the halo regions 12a and 12b in the channel length direction. The p-type semiconductor regions 14a and 14b extend to immediately below gate sidewalls 22, which will be described later.

The polycrystalline silicon layer 18, the tungsten layer 19, and the silicon nitride layer 20 form a multilayer structure, and an oxide film 21 is disposed on side faces and a top face of the multilayer structure. The gate sidewalls 22 are also disposed on the side faces of the multilayer structure with the oxide film 21 being disposed therebetween.

In the semiconductor device according to the embodiment having the above-described configuration, the region 16a containing carbon is disposed between the p-type semiconductor region 14a and the p-type semiconductor region 15a, and the region 16b containing carbon is disposed between the p-type semiconductor region 14b and the p-type semiconductor region 15b. The regions 16a and 16b containing carbon prevent the p-type semiconductor regions 14a and 14b having a high boron concentration from diffusing boron. Since the p-type semiconductor regions 15a and 15b having a lower concentration are disposed below the regions 16a and 16b containing carbon, if a high voltage is applied to one (drain) of the semiconductor regions 14a and 14b, depletion layers of the p-type semiconductor region 14a and 14b having a higher concentration and the p-type semiconductor regions 15a and 15b having a lower concentration are connected. This may prevent junction leakage.

As can be understood from a method of manufacturing the semiconductor device according to the embodiment, which will be described later, the p-type semiconductor regions 14a and 14b, the p-type semiconductor regions 15a and 15b, and the regions 16a and 16b containing carbon are formed by ion implantation after the gate sidewalls 22 are formed. Since a p-type impurity (for example, boron) is diffused by annealing, ends of the p-type semiconductor regions 14a and 14b on sides of the channel region 11 in a first direction from the semiconductor region 14a to the semiconductor region 14b are located immediately below the gate sidewalls 22. In contrast, ends of the regions 16a and 16b containing carbon on the channel region sides in the first direction are unlikely to extend to immediately below the gate sidewalls 22 since carbon is unlikely to be diffused by annealing. Therefore, the end on the channel region 11 side of the region 16a containing carbon is more distant from the center of the channel region 11 in the first direction than the end on the channel region 11 side of the p-type semiconductor region 14a, and more distant from the center of the channel region 11 than the end on the channel region 11 side of the p-type semiconductor region 15a. Similarly, the end on the channel region 11 side of the region 16b containing carbon is more distant from the center of the channel region 11 in the first direction than the end on the channel region 11 side of the p-type semiconductor region 14b, and more distant from the center of the channel region 11 in the first direction than the end on the channel region 11 side of the p-type semiconductor region 15b.

The end of the region 16a containing carbon in the first direction is more distant from the center of the channel region 11 than an end (side face) on the semiconductor region 14a side of the gate electrode. Similarly, the end of the region 16b containing carbon in the first direction is more distant from the center of the channel region 11 than an end (side face) on the semiconductor region 14b side of the gate electrode. Thus, the ends of the regions 16a and 16b containing carbon are located on the outer sides of the corresponding side faces (ends) of the gate electrode.

Therefore, the carbon concentration in any portion of the channel region 11 immediately below the gate electrode is lower than that of the regions 16a and 16b containing carbon. Specifically, a portion of the channel region 11 that is located below lower portions of at least one of the ends 18a and 18b of the gate electrode, a portion between the ends 18a and 18b, and a portion between the regions 16a and 16b containing carbon do not contain carbon, or have a lower carbon concentration than the regions 16a and 16b containing carbon. The carbon concentration in the above-described portions may be lower than the detection limit of carbon.

A portion located immediately below the gate sidewalls 22, and a portion between the region 16a containing carbon and the region 16b containing carbon do not contain carbon, or have a lower carbon concentration than the regions 16a and 16b containing carbon.

(Manufacturing Method)

A method of manufacturing the transistor shown in FIG. 1 will be described below with reference to FIGS. 2 to 10.

Figure 2:
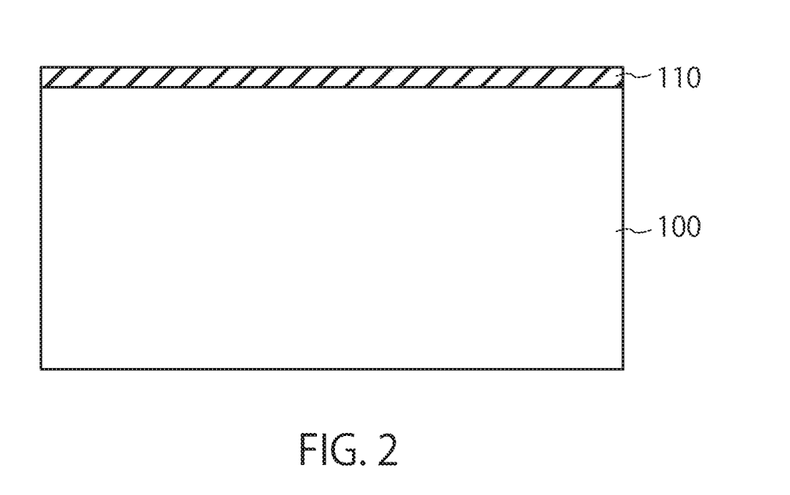
FIGS. 2 to 10 are cross-sectional views showing a method of manufacturing a semiconductor device according to the embodiment.
Figure 3:
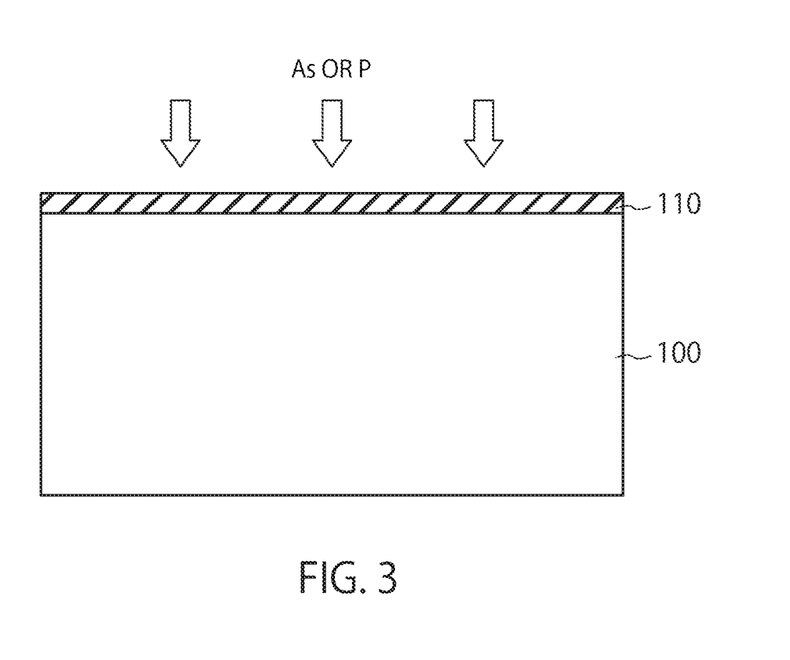

First, an oxide film 110 is formed on an n-type silicon layer 100 (FIG. 2). Subsequently, an n-type impurity (for example, arsenic (As) or phosphorus (P)) is doped into the silicon layer through the oxide film 110 as shown in FIG. 3 to form an n-type well region or channel region.

Figure 4:
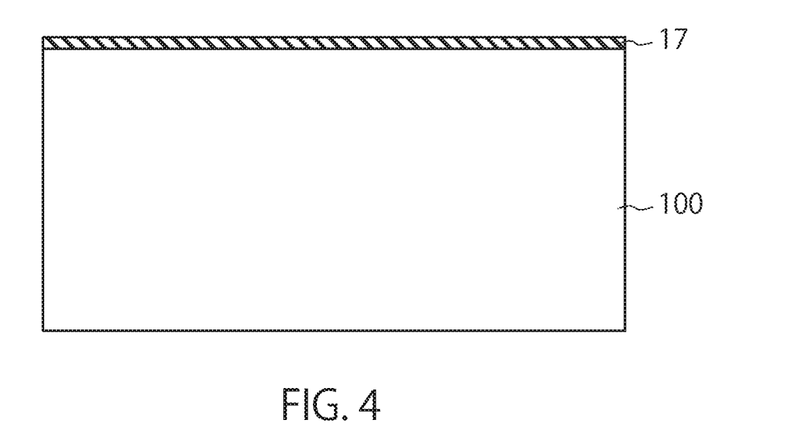
Figure 5:
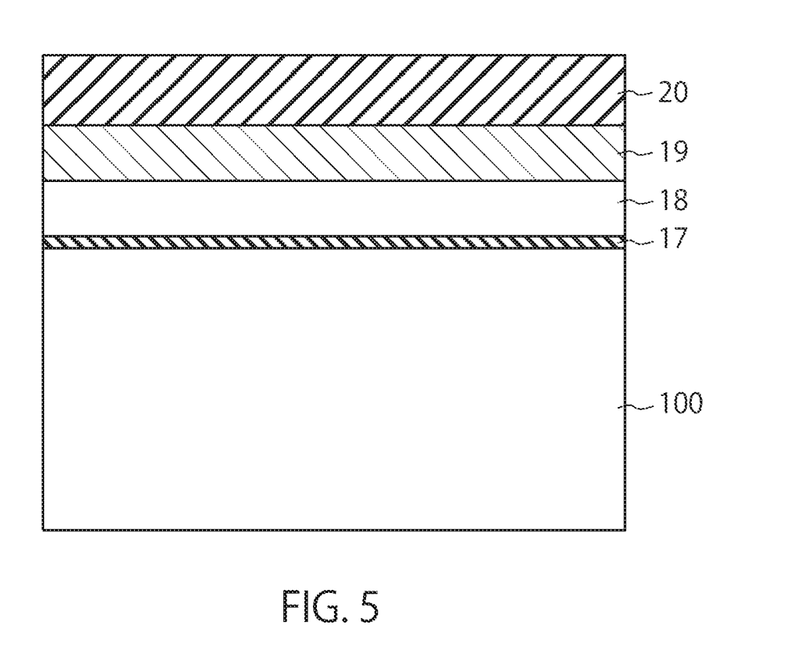

The oxide film 110 is then removed from the silicon layer 100, and an insulating film 17 to serve as a gate insulating film is formed on the n-type silicon layer 100, as shown in FIG. 4. Thereafter, a polycrystalline silicon layer 18, a tungsten layer 19, and a silicon nitride layer 20 are sequentially formed on the insulating film 17 as shown in FIG. 5.

Figure 6:
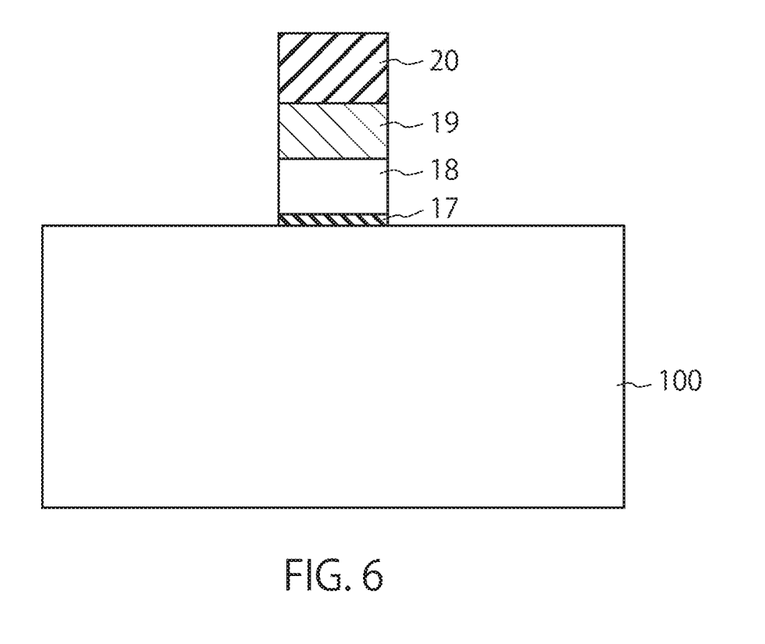

Next, a resist mask (not shown) is formed on the silicon nitride layer 20, and the silicon nitride layer 20 is patterned to have a shape of a gate electrode using the resist mask. The patterned silicon nitride layer 20 is then used as a mask to pattern the tungsten layer 19, the polycrystalline silicon layer 18, and the insulating film 17. As a result, a multilayer structure of the gate electrode is formed on the n-type silicon layer 100 (FIG. 6).

Figure 7:
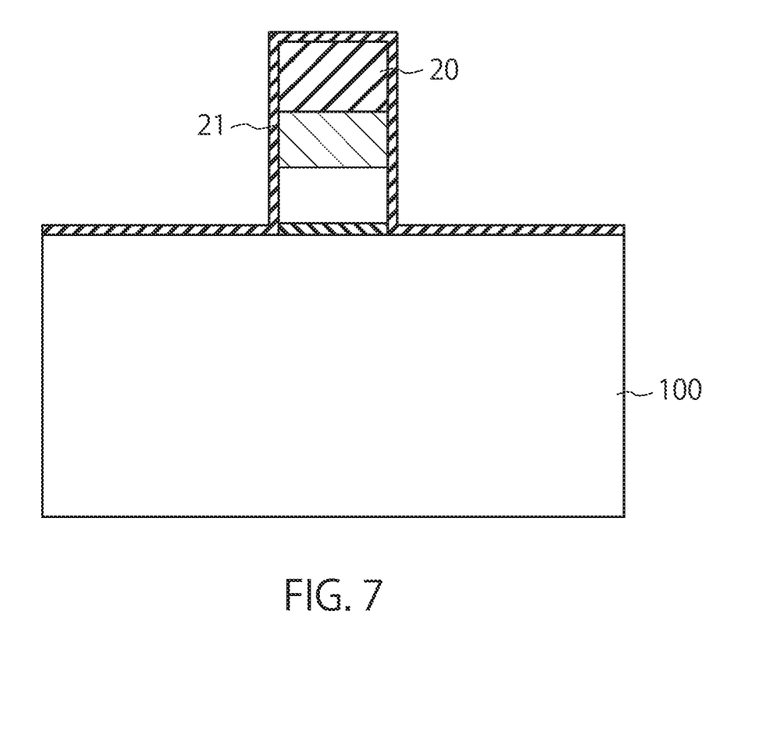
Figure 8:
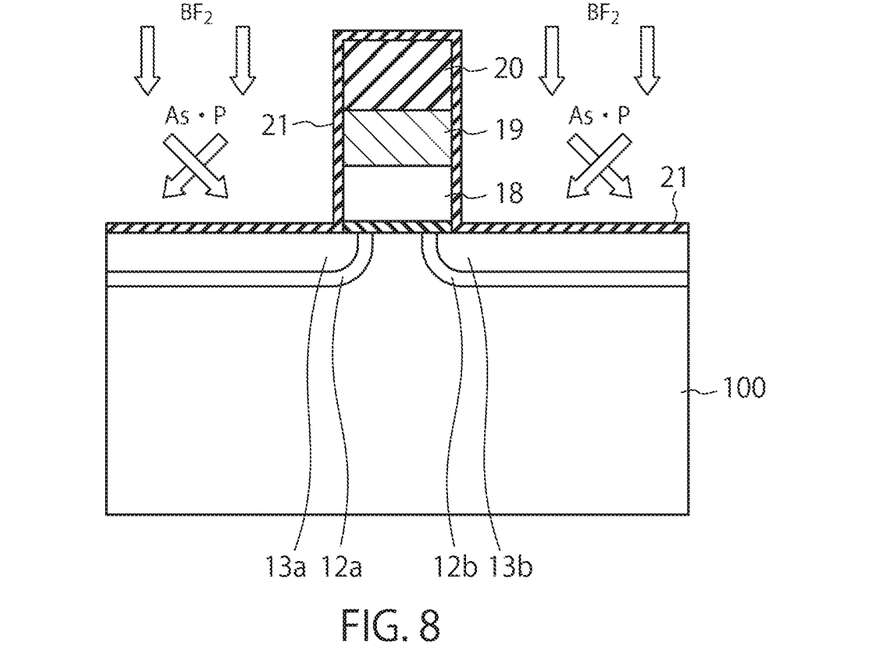

Thereafter, an oxide film (for example, a silicon oxide film) 21 is formed on side faces and a top face of the gate structure as shown in FIG. 7. Then, an n-type impurity (for example, arsenic (As) or phosphorus (P)) is implanted into the n-type silicon layer 100 to form halo regions 12a and 12b, by using the multilayer structure as a mask. Furthermore, boron fluoride is implanted into the n-type silicon layer 100 to form p-type semiconductor regions 13a and 13b by using the multilayer structure as a mask (FIG. 8).

Figure 9:
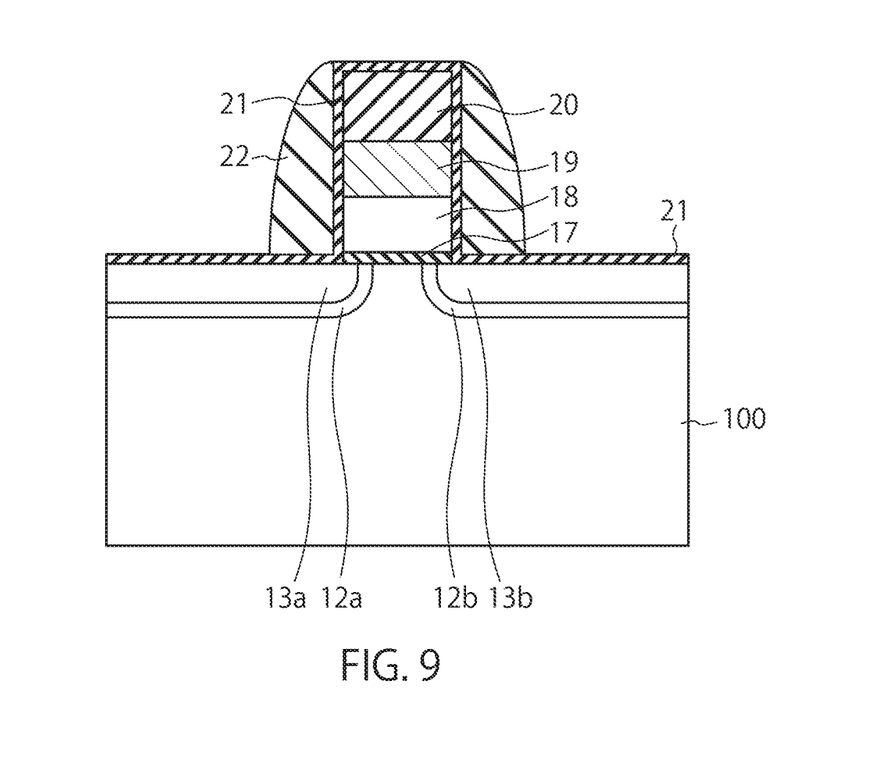
Figure 10:
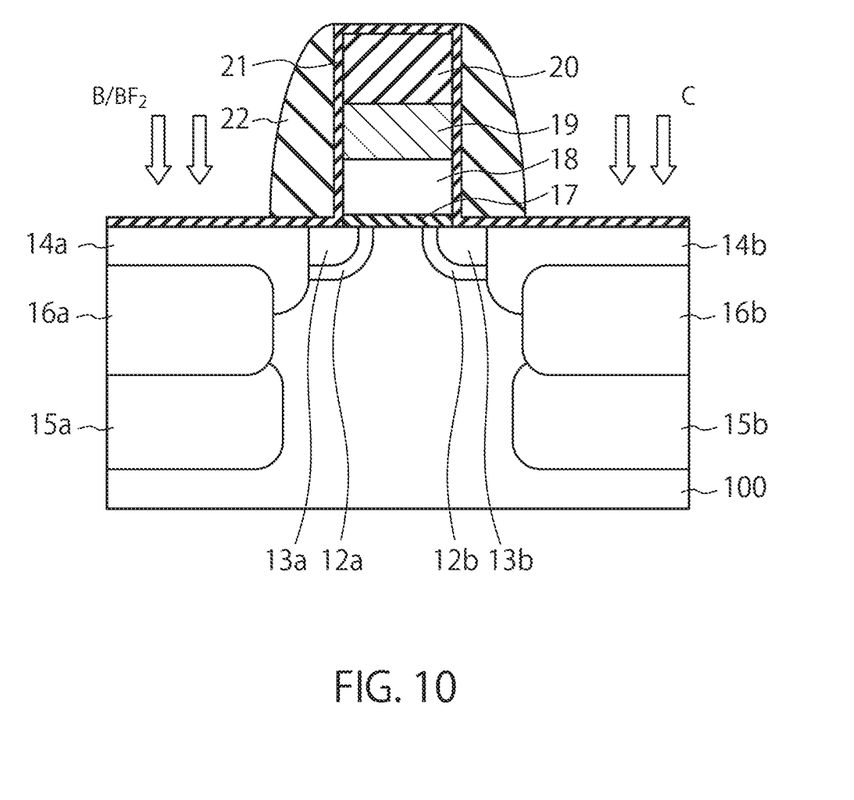

Next, as shown in FIG. 9, gate sidewalls 22 of an insulating material (such as silicon oxide) are formed on side faces of the multilayer structure. The multilayer structure with the gate sidewalls 22 is then used as a mask for ion implantation of a p-type impurity (such as boron) with an acceleration voltage of 60 KeV to 80 Key to a dose amount of $1.0 \times 10^{13}$ cm$^{-2}$ to $3.0 \times 10^{13}$ cm$^{-2}$, as shown in FIG. 10, in order to form p-type semiconductor regions 15a and 15b having a depth of 0.15 μm to 0.4 μm. The multilayer structure with the gate sidewalls 22 is further used as a mask for ion implantation of boron fluoride with an acceleration voltage of 20 Key to 30 Key, and a dose amount of $1.0 \times 10^{15}$ cm$^{-2}$ to $2.0 \times 10^{15}$ cm$^{-2}$ to form p-type semiconductor regions 14a and 14b having a depth of less than 0.05 μm. The multilayer structure with the gate sidewalls 22 is then used as a mask for ion implantation of carbon with an acceleration voltage of 20 Key to 40 Key and a dose amount of $1.0 \times 10^{16}$ cm$^{-2}$ to $2.0 \times 10^{16}$ cm$^{-2}$ to form regions 16a and 16b containing carbon, which has a depth of 0.05 μm to 0.15 μm. During the ion implantation of carbon, germanium (Ge) may also be implanted. It is widely known that pre-amorphization implantation (PAI) helps carbon occupy lattice sites easily, which improves the boron diffusion prevention effect. Therefore, ion implantation of germanium (Ge) is performed with an acceleration voltage of 30 KeV to 50 KeV and a dose amount of $5.0 \times 10^{14}$ cm$^{-2}$ to $1.0 \times 10^{15}$ cm$^{-2}$ to form a semiconductor region having a depth of 0.1 μm to 0.15 μm.

Then, the semiconductor regions 12a, 12b, 13a, 13b, 14a, 14b, 15a, and 15b are activated by annealing. As a result, the semiconductor regions 14a and 14b become a source region and a drain region, and the regions 16a and 16b containing carbon become clusters containing boron, carbon, and interstitial silicon. Thereafter, the oxide film 21 on the source and drain regions 14a and 14b is removed to complete the transistor 10 shown in FIG. 1.

An activated impurity concentration distribution of the transistor 10 manufactured by the above-described method will then be described.

Figure 11:
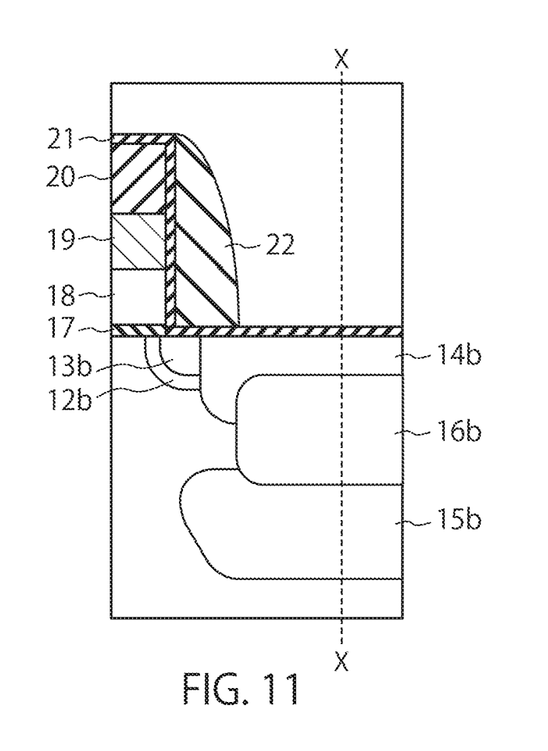
FIG. 11 is a diagram showing a cross section of measuring an impurity concentration in the semiconductor device according to the embodiment.
Figure 12:
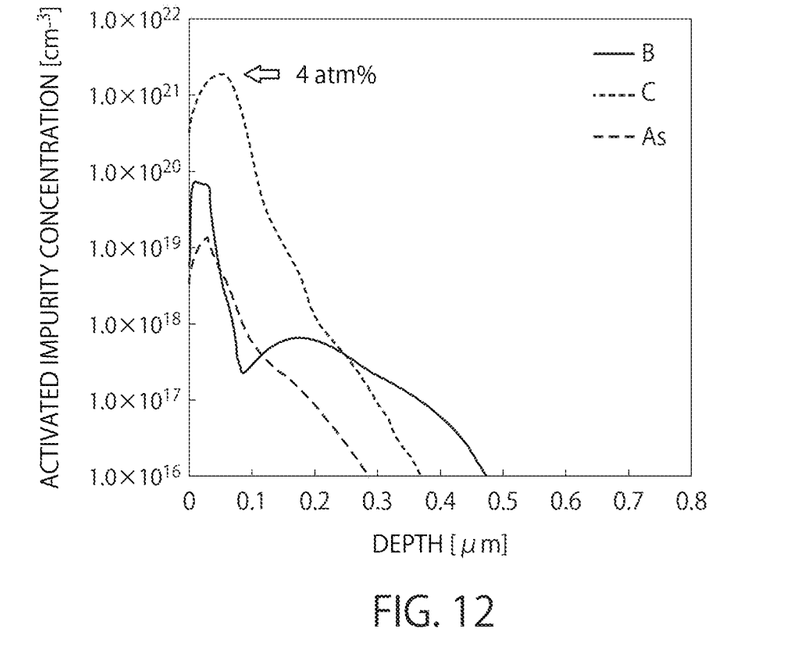
FIG. 12 is a diagram showing impurity concentrations in the semiconductor device according to the embodiment.
Figure 13:
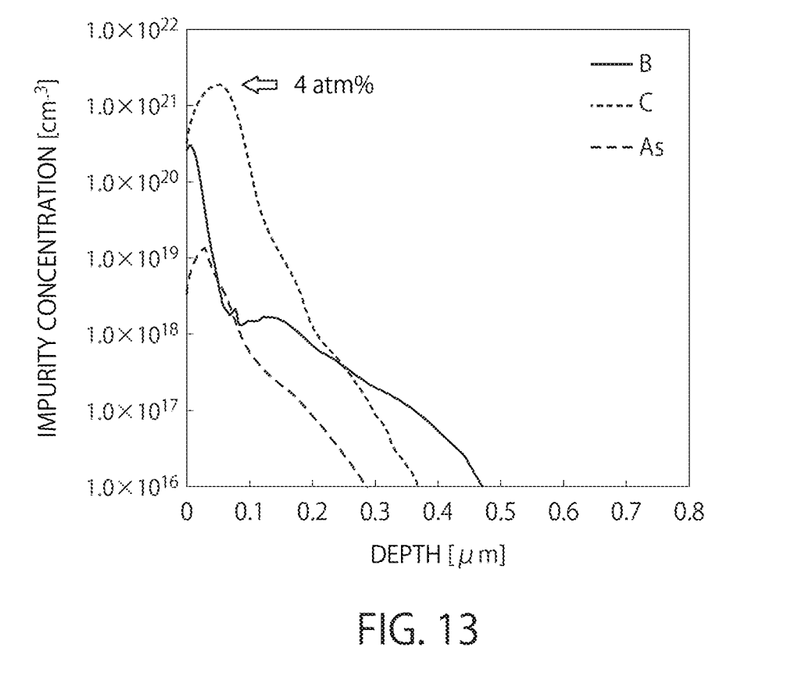
FIG. 13 is a diagram showing impurity concentrations in the semiconductor device according to the embodiment.

A simulation is performed to study the distribution of impurity concentration before and after the annealing for activation with respect to the section X-X of the transistor 10 shown in FIG. 11. FIG. 12 shows the impurity concentration after the activation, and FIG. 13 shows the impurity concentration before the activation. In each of FIGS. 12 and 13, the horizontal axis represents the depth from the surface of the silicon semiconductor layer 100, and the vertical axis represents the concentration of activated impurity. In FIG. 12, the solid line indicates a boron (B) concentration distribution, the broken line indicates a carbon (C) concentration distribution, and the dashed line indicates an arsenic (As) concentration distribution.

As can be understood from FIGS. 12 and 13, there is almost no change in the carbon and arsenic concentration distributions after the annealing. The peak concentration of carbon is 4 atom % at the depth of 0.06 μm. Thus, the peak concentration of carbon is more than 3 atom %. After the annealing, boron is bonded with carbon and interstitial silicon to form clusters, which are not activated. Therefore, in a region where the amount of implanted carbon is large, the activated boron concentration decreases. This means that the semiconductor region 14b and the semiconductor region 15b are clearly separated from each other by the region containing carbon.

Figure 14:
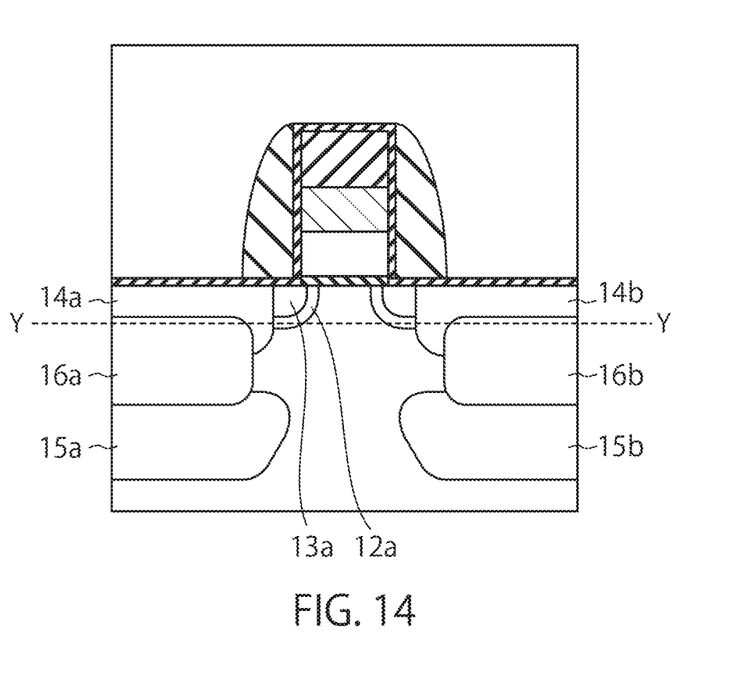
FIG. 14 is a diagram showing a cross section of measuring an impurity concentration in the semiconductor device according to the embodiment.
Figure 15:
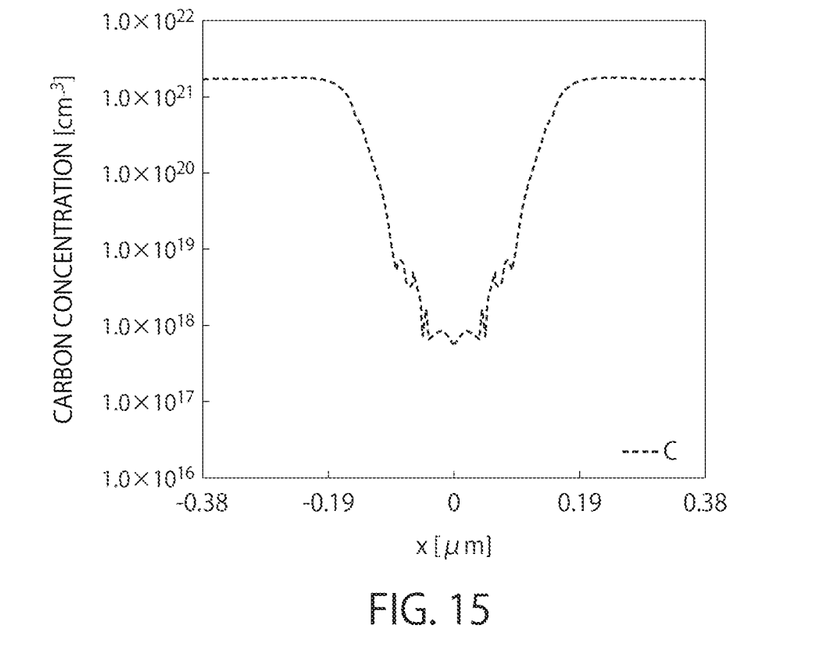
FIG. 15 is a diagram showing impurity concentrations of the semiconductor device according to the embodiment.

Next, a simulation is performed to study the distribution of carbon impurity concentration with respect to the section Y-Y of the transistor 10 shown in FIG. 14. FIG. 15 shows the impurity concentration of activated carbon. The section Y-Y is a plane that is parallel to the surface of the silicon semiconductor layer 100 and includes the region 16a containing carbon, the channel region, and the region 16b containing carbon. In FIG. 15, the horizontal axis represents the distance x measured from the center of the channel region (point of origin), in which the negative direction is a direction toward the region 16a containing carbon, and the positive direction is a direction toward the region 16b containing carbon, and the vertical axis represents the carbon concentration distribution.

As can be understood from FIG. 15, the carbon concentration in the channel region is three or more orders of magnitude less than that of the regions 16a and 16b containing carbon. This means that the channel region contains substantially no carbon.

Figure 16:
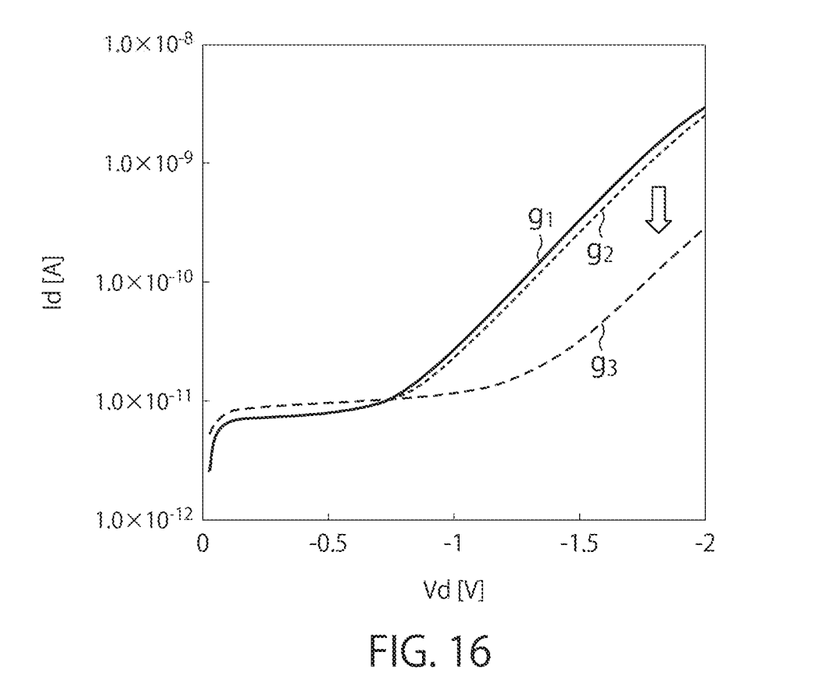
FIG. 16 is a diagram showing an improvement in the breakdown voltage of the semiconductor device according to the embodiment.

FIG. 16 shows results (Id-Vd characteristics) of simulations for obtaining a drain current Id when a drain voltage Vd is applied to each of a p-channel transistor in which no element is located below the source region and the drain region, which is prepared as Comparative Example 1, a p-channel transistor in which the source region and the drain region are connected to p-type semiconductor regions having a lower impurity concentration, which is prepared as Comparative Example 2, and the p-channel transistor according to the embodiment. In FIG. 16, the lines $g_1$, $g_2$, and $g_3$ represent the Id-Vd characteristics of Comparative Example 1, Comparative Example 2, and the first embodiment. As can be understood from FIG. 16, the drain current Id is slightly lower in Comparative Example 2 than in Comparative Example 1. This means that the improvement in breakdown voltage is slight in Comparative Example 2. In contrast, the drain current Id of the transistor according to the embodiment in the drain voltage range from −1.0 V to −2 V is considerably lower than that of the transistors of Comparative Example 1 and Comparative Example 2. This means that the breakdown voltage is considerably improved.

Figure 17:
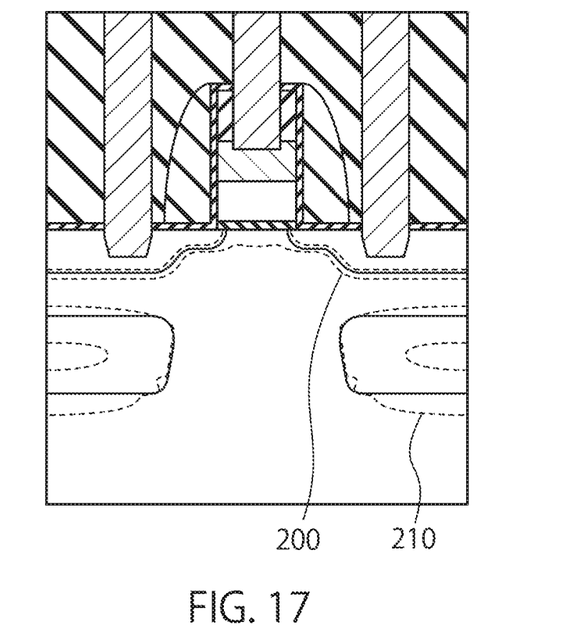
FIG. 17 is a diagram showing depletion layers of impurity layers when no drain voltage is applied to the semiconductor device according to the embodiment.
Figure 18:
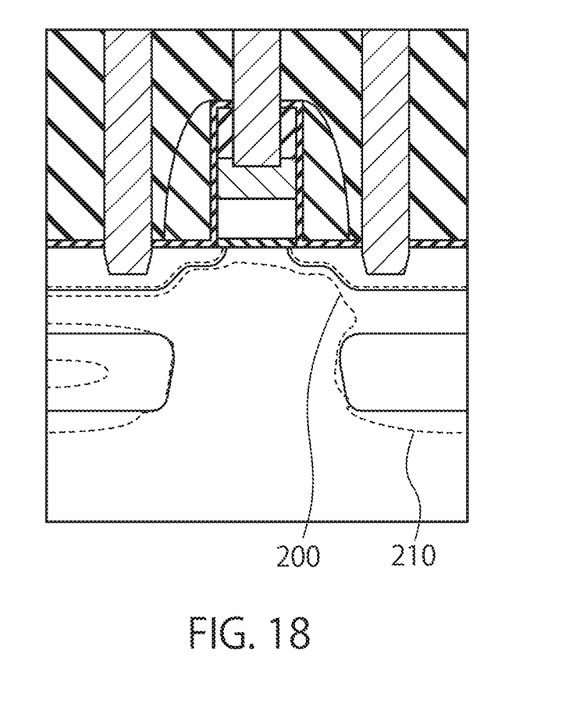
FIG. 18 is a diagram showing the depletion layers of the impurity layers when a drain voltage is applied to the semiconductor device according to the embodiment.

In order to study the reason why the breakdown voltage of the transistor according to the embodiment is considerably improved, the depletion layer distributions of the high concentration p-type semiconductor region 14b and the semiconductor region 15b in the transistor according to the embodiment are simulated in the case where no drain voltage is applied (Vd=0V) and the case where the drain voltage Vd is −1.8V. FIG. 17 shows the depletion layer distribution in the case where the drain voltage Vd is 0 V, and FIG. 18 shows the depletion layer distribution in the case where the drain voltage Vd is −1.8 V. In FIGS. 17 and 18, the reference numeral 200 denotes the depletion layer distribution of the semiconductor region 14b, and the reference numeral 210 denotes the depletion layer distribution of the semiconductor region 15b.

As can be understood from FIG. 17, the depletion layers 200 and 210 are separated from each other if no drain voltage Vd is applied. However, as can be understood from FIG. 18, if the drain voltage Vd of −1.8 V is applied, the depletion layer 200 and the depletion layer 210 are joined together. Thus, the application of the drain voltage Vd joins the depletion layer of the semiconductor region 14b and the depletion layer of the semiconductor region 15b, and this may be the reason why the breakdown voltage is considerably improved.

As described above, a semiconductor device according to the embodiment includes a p-channel MOS transistor that is capable of preventing junction leakage.

Since the breakdown voltage of the p-channel MOS transistor according to the embodiment is high, the p-channel MOS transistor may be used as a selection transistor for selecting a cell of an NAND flash memory. In this case, if the p-channel MOS transistor according to the embodiment is used as a p-channel transistor other than the selection transistor, for example a p-channel transistor of a periphery circuit, the p-channel MOS transistors can be formed through the same steps in the manufacturing process. This enables the reduction in manufacturing costs.

The p-channel MOS transistor of the embodiment may also be used as a transistor for selecting and applying a high voltage to a one time programmable (OTP) memory element. A MOS transistor to which data is written by breaking its gate insulating film, for example, may be used as the OTP memory element. The p-channel MOS transistor according to the embodiment may also be used as a p-channel transistor that is connected to a first wiring line connected to the gate of the MOS transistor and/or a second wiring line connected to the source or the drain of the MOS transistor to apply a high voltage to the first wiring line or the second wiring line.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first semiconductor region of a first conductivity type and a second semiconductor region of the first conductivity type, which are disposed to be separate from each other;
   a third semiconductor region of a second conductivity type disposed between the first semiconductor region and the second semiconductor region;
   a fourth semiconductor region of the first conductivity type disposed below the first semiconductor region and having a lower concentration of a first conductivity type impurity than the first semiconductor region;
   a fifth semiconductor region of the first conductivity type disposed below the second semiconductor region and having a lower concentration of the first conductivity type impurity than the second semiconductor region;
   a first region containing carbon, first conductivity type impurities, and second conductivity type impurities, and the first region being disposed between the first semiconductor region and the fourth semiconductor region;
   a second region containing carbon, the first conductivity type impurities, and the second conductivity type impurities, and the second region being disposed between the second semiconductor region and the fifth semiconductor region;
   a third region disposed between the first region and the second region;
   a gate electrode disposed above the third semiconductor region; and
   an insulating film disposed between the third semiconductor region and the gate electrode,
   the first conductivity type impurities including boron,
   a location of a peak concentration of carbon in the first region being deeper than a location of a peak concentration of boron in the first semiconductor region and being shallower than a location of a peak concentration of boron in the fourth semiconductor region,
   a location of a peak concentration of carbon in the second region being deeper than a location of a peak concentration of boron in the second semiconductor region and being shallower than a location of a peak concentration of boron in the fifth semiconductor region,
   the peak concentration of carbon in the first region being higher than the peak concentration of boron in the first semiconductor region,
   the peak concentration of carbon in the second region being higher than the peak concentration of boron in the second semiconductor region, and
   in at least one of the first region or the second region, a concentration of activated first conductivity type impurities being lower than a concentration of activated second conductivity type impurities.

2. The semiconductor device according to claim 1, wherein the first semiconductor region, the second semiconductor region, the fourth semiconductor region, and the fifth semiconductor region contain boron.

3. The semiconductor device according to claim 2, wherein the first region and the second region further contain boron and silicon, and include a cluster of carbon, boron and interstitial silicon.

4. The semiconductor device according to claim 1, wherein the third semiconductor region contains silicon.

5. The semiconductor device according to claim 1, wherein a peak concentration of carbon in each of the first region and the second region is greater than 3 atom %.

6. The semiconductor device according to claim 1, further comprising:
   a sixth semiconductor region of the second conductivity type disposed between the first semiconductor region and the third semiconductor region; and
   a seventh semiconductor region of the second conductivity type disposed between the second semiconductor region and the third semiconductor region.

7. The semiconductor device according to claim 6, further comprising:
   an eighth semiconductor region of the first conductivity type disposed between the first semiconductor region and the sixth semiconductor region; and
   a ninth semiconductor region of the first conductivity type disposed between the second semiconductor region and the seventh semiconductor region.

8. The semiconductor device according to claim 1, wherein the gate electrode includes a metal layer and a semiconductor layer disposed between the metal layer and the insulating film.

9. The semiconductor device according to claim 1, wherein the second conductivity type impurities include arsenic or phosphorus.

10. The semiconductor device according to claim 1, wherein the first region has a first carbon concentration, the second region has a second carbon concentration, the third region not contains carbon or has a lower carbon concentration than the first carbon concentration and the second carbon concentration in a portion below at least one of ends of a lower face of the gate electrode in a first direction from the first semiconductor region to the second semiconductor region.

* * * * *